United States Patent
Negro et al.

(10) Patent No.: US 6,661,035 B2
(45) Date of Patent: Dec. 9, 2003

(54) LASER DEVICE BASED ON SILICON NANOSTRUCTURES

(75) Inventors: Luca Dal Negro, Verona (IT); Giorgia Franzo', San Giovanni La Punta (IT); Zeno Gaburro, Verona (IT); Fabio Iacona, Aci Castello (IT); Lorenzo Pavesi, Trento (IT); Francesco Priolo, San Giovanni La Punta (IT)

(73) Assignees: INFM Instituto Nazionale per la Fisica Della Materia, Geneva (IT); Universita'Degli Studi di Trento, Trento (IT); Universita'Degli Studi di Catania, Catania (IT); Consiglio Nazionale Della Ricerche, Roma (IT)

( * ) Notice: Subject to any disclaimer, the term of this patent is extended or adjusted under 35 U.S.C. 154(b) by 0 days.

(21) Appl. No.: 09/989,456

(22) Filed: Nov. 21, 2001

(65) Prior Publication Data

US 2002/0163003 A1 Nov. 7, 2002

(30) Foreign Application Priority Data

May 7, 2001 (IT) ......................................... TO201A424

(51) Int. Cl.[7] ....................... H01L 29/88; H01L 29/861; H01S 5/00; H01S 3/091
(52) U.S. Cl. ............................ 257/105; 372/43; 372/70
(58) Field of Search ...................... 372/43, 70; 257/103

(56) References Cited

U.S. PATENT DOCUMENTS 5,757,837 A * 5/1998 Lim et al. ...................... 372/43
5,852,346 A 12/1998 Komoda et al.
6,067,307 A * 5/2000 Krishnamoorthy ........... 372/26

OTHER PUBLICATIONS

Gritsenko et al., Silicon nanocluster in silicon nitride: PL, Raman scattering and ESR studies, vol. 8, 1997, pp. 196–199, IEEE.*
T. Baron et al, Silicon quatum dot nucleation on Si3N4, SiO2 and SiOxNy substrates for nanoelectronic devices, Journal of Crystal growth, 209, (2000) 1004–1008.*
Streetman (Solid State Electronic Devices, 4th edition, pp. 384–390).*
L. Pavesi, et al., "Optical gain in silicon nanocrystals" *Nature* vol. 408, pp. 440–444, Nov. 2000.
K. D. Hirschman, et al., "Silicon–based visible light emitting devices integrated into microelectronic circuits" *Nature*, vol. 384, pp. 338–340, (1996).
L. T. Canham "Silicon quantum wire array fabrication by electrochemical and chemical dissolution of wafers", *Appl. Phys. Lett.*, vol. 57, pp. 1045–1048, (1990).

* cited by examiner

Primary Examiner—Steven Loke
Assistant Examiner—Samuel A Gebremariam
(74) Attorney, Agent, or Firm—Sughrue Mion, PLLC

(57) ABSTRACT

A silicon-based light-emitting device is described and comprises an active region, an excitation system which can bring about a condition of inversion of the population of carriers within the active region, and semi-reflective elements which can define a resonant optical structure in which the active region is inserted so as to bring about stimulated emission of coherent light. The active region comprises silicon nanostructures immersed in a silicon-dioxide-based dielectric matrix.

23 Claims, 2 Drawing Sheets

LASER DEVICE BASED ON SILICON NANOSTRUCTURES

FIELD OF THE INVENTION

The present invention relates to a light-emitting device and, in particular, to a silicon-based laser device.

BACKGROUND OF THE INVENTION

The addition of optical functional capabilities to electronic microcircuits integrated on silicon chips is an objective which is of the greatest importance in the telecommunications field and in the development of electronics, optoelectronics and photonics circuits and materials.

A coherent light source (a laser) is a key element in optoelectronic applications.

As is well known, silicon is the currently-preferred semiconductor and is widely used in electronic circuits, owing to its physical properties, its reliability, and its low cost.

Silicon is a semiconductor with an indirect band gap and the very poor properties of the material as a light-emitting source are due to this characteristic. In fact, in order for light emission to occur, a further energy-transfer process (interaction with phonons) has to take part in the recombination of the charge carriers, and non-radiative recombinations are more likely than radiative ones.

For this reason, silicon has always been considered unsuitable for optoelectronic applications and the integration of optical elements with microelectronic circuits is currently achieved with the use of compound semiconductors with direct band gaps, in particular, compounds of groups III–V.

Advanced composite semiconductor laser devices adopt, as the active medium for achieving optical amplification, single-dimensional quantum structures (quantum dots) or two-dimensional quantum structures (quantum wells).

It is known that the properties of silicon depend on its structure on a nanometric scale and it has recently been shown that it is possible to bring about light emission at ambient temperature when the silicon forms a single-dimensional or two-dimensional quantum structure.

Silicon-based electroluminescent devices have therefore been produced, for example, as described by K. D. Hirschman, L. Tsybeskov, S. P. Duttagupta and P. M. Fauchet in Nature 384, pages 338–340 (1996), in an article entitled "Silicon based light emitting devices integrated into microelectronic circuits".

Silicon nanostructures (for example, porous silicon) can emit light as a result of the quantum confinement of the carriers if they are stimulated by light of short wavelength of the order of 488 nm, as documented in the article entitled "Silicon quantum wire array fabrication by electrochemical and chemical dissolution of wafers" by L. T. Canham which appeared in the journal Appl. Phys. Lett. 57, pages 1045–1048 (1990).

In spite of the interesting properties of porous silicon, it is not very suitable for the production of commercial devices because of the large internal surface of its structure which is highly reactive and results in characteristics of the material which are greatly dependent on the atmosphere in which it is immersed. Moreover, in microelectronic applications, the manufacturing processes, which take place in a moist environment, are somewhat incompatible with the dry manufacturing processes which are typical of the manufacture of integrated semiconductor electronic circuits.

However, up to now, it has not been possible to achieve optical gain and stimulated emission and thus to produce devices which emit coherent light (lasers) since silicon shows efficient absorption of the free carriers, which reduces the net gain available for the laser effect.

SUMMARY OF THE INVENTION

The object of the present invention is therefore to provide a satisfactory solution to the problems set out above, by providing a silicon-based device for emitting coherent light, and a silicon-based material therefor.

According to the present invention, this object is achieved by means of a light-emitting device having the characteristics recited in claim 1.

Particular embodiments of the invention are defined in the dependent claims.

Another subject of the invention is a chip according to claim 18.

Still another subject of the invention is a material according to claim 20.

In summary, the present invention is based on the principle of achieving optical gain on the basis of an active region comprising a set of amorphous or crystalline silicon nanostructures, preferably with radii of the order of 1.5 nm, placed in a silicon dioxide substrate so as to form a high-density thin layer buried beneath the surface of the sample in question.

Further characteristics and advantages of the invention will be explained in greater detail in the following detailed description, given by way of non-limiting example with reference to the appended drawings.

DETAILED DESCRIPTION OF THE PREFERRED EMBODIMENTS

A light-emitting device according to the invention is indicated 10. The device comprises an active region 12 in which amorphous or crystalline silicon nanostructures are formed in a dielectric matrix based on silicon dioxide.

The active region 12 is inserted in a resonant optical structure which is formed, according to the currently-preferred embodiment, by a pair of distributed Bragg reflectors 14 and 16 disposed on opposite sides of the active region 12 along the predetermined light-emission axis so as to form a single-dimensional optical cavity along that axis, with high reflectivity within a desired range of wavelengths.

In a possible alternative embodiment (not shown), the device comprises a Bragg grating disposed adjacent the active region 12 so as to form a distributed-feedback structure which can be incorporated in optical wave-guides.

Figure 1:
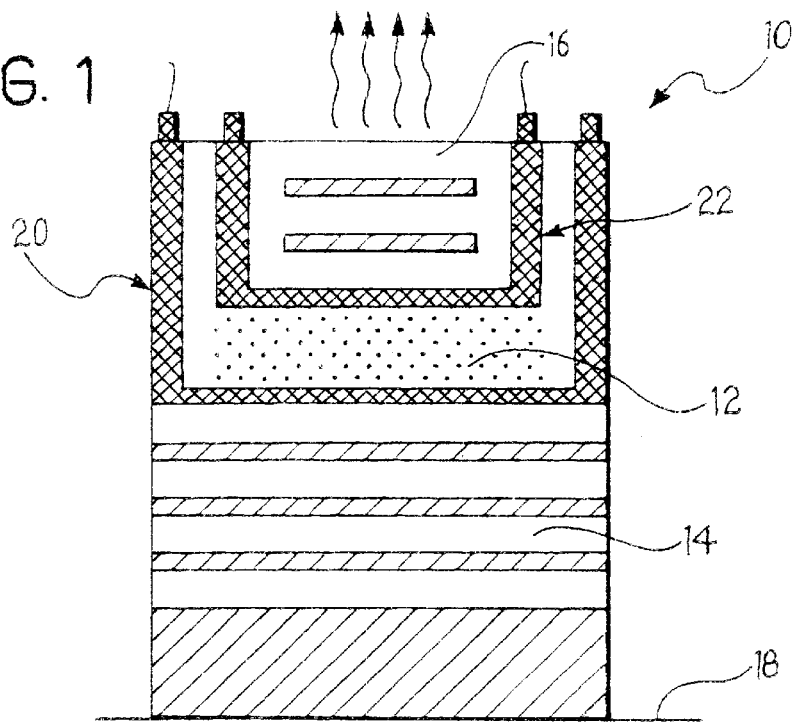
FIG. 1 shows a first embodiment of the light-emitting device according to the invention, in section.
Figure 2:
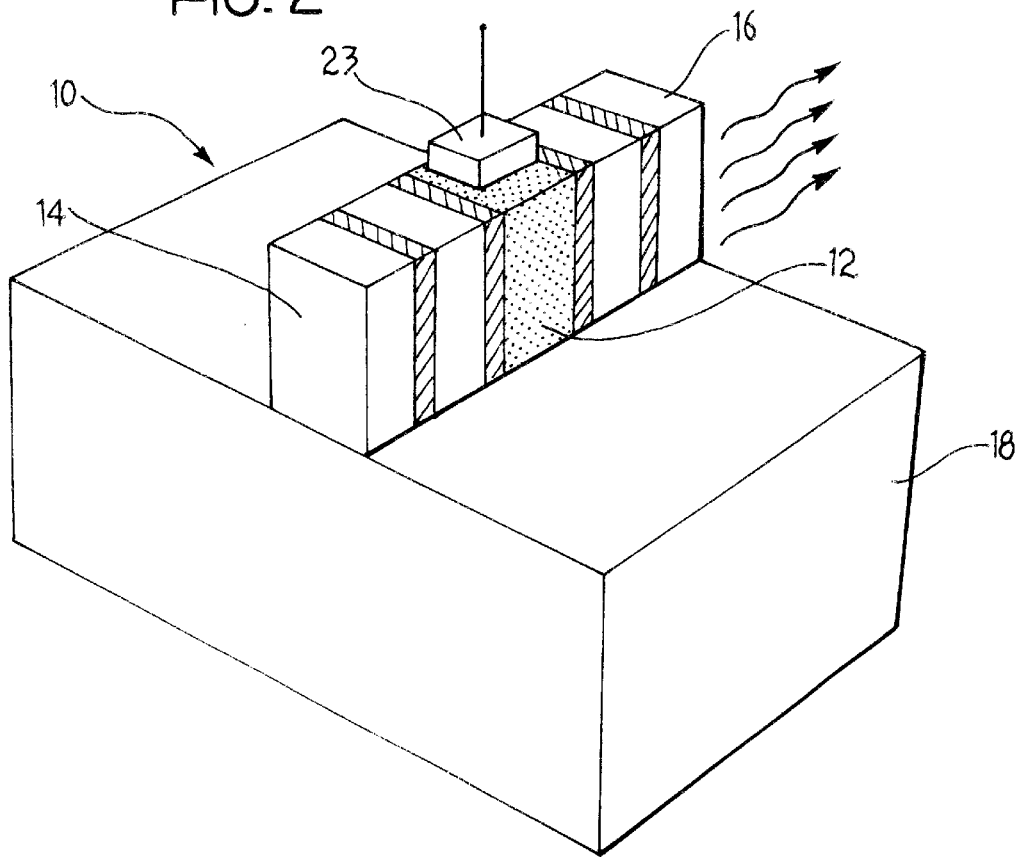
FIG. 2 shows a second embodiment of the light-emitting device according to the invention, in a three-dimensional, schematic view.
Figure 4:
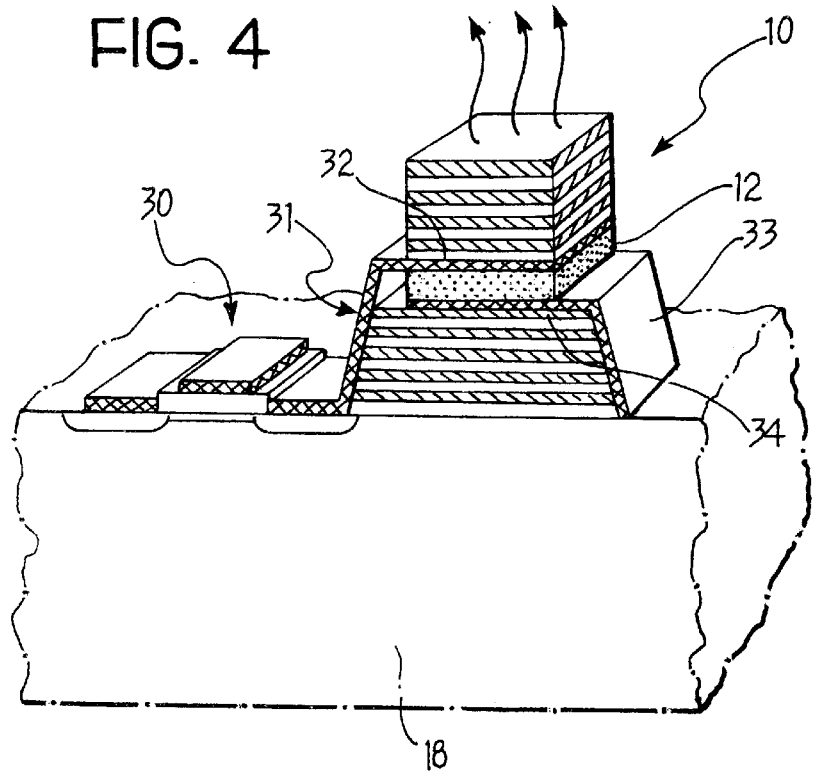
FIG. 4 shows an example of the integration of a light-emitting device according to the invention in an electronic circuit formed in CMOS technology.

When the device according to the invention is integrated into silicon chips on which electronic integrated circuits are formed, it may be positioned in a vertical arrangement (as shown in FIGS. 1 and 4), or in a horizontal arrangement (as shown in FIG. 2); identical or functionally equivalent elements are indicated by the same reference numerals in the drawings.

A pair of contacts for the injection of carriers is defined at the ends of the active region 12, along the light-emission axis, or along a perpendicular axis, respectively.

According to a first embodiment in which the device 10 has a vertical orientation relative to a reference substrate plane 18, electrical contacts 20 and 22 are formed as deep annular channels of doped polysilicon, as shown in FIG. 1, arranged concentrically and insulated from one another by an oxide layer. They carry, at their buried ends, respective terminals for contact with the active region 12 so as to inject the carriers substantially along an axis coinciding with the predetermined light-emission axis.

Alternatively, the contacts may be constituted by a simple MOS (metal-oxide-semiconductor) structure perpendicular to the light-emission axis, comprising an electrode 23, the active region 12, and the substrate 18, as shown in FIG. 2 for a device 10 which is to be formed with a horizontal orientation relative to the reference substrate plane 18. In this latter case, the device may be incorporated directly in an optical wave-guide.

Naturally, in dependence on the applications for which the laser device 10 is intended, the excitation of the active region 12 may alternatively be achieved by optical pumping in accordance with a configuration well known to a person skilled in the art, although this is not shown in the drawings. This solution, which has no metal contacts for the injection of carriers, is preferred for entirely optical or photon applications in which the requirements for integration with microelectronic circuits are not stringent.

According to a first solution, the silicon (Si) nanostructures may be formed by ion implantation of Si ions in high doses (of the order of $10^{17}/cm^2$) in a high-quality silicon dioxide ($SiO_2$) matrix, followed by an annealing step which brings about aggregation of the Si into nanocrystals. A method of this type is described, for example, in U.S. Pat. No. 5,852,346 incorporated herein by reference.

Silicon nanocrystals have been produced by ion implantation, at 80 keV, of $1 \times 10^{17}$ Si ions per $cm^2$ in ultra-pure quartz substrates or in silicon dioxide layers grown thermally on a silicon substrate, followed by thermal treatment at a temperature of 1100° C. for 1 hour.

Quartz substrates may advantageously be used for the manufacture of devices for use in optical transmission systems, whereas devices grown on silicon substrates are suitable for integration with electronic microcircuits.

An alternative manufacturing process provides for the chemical vapour deposition of sub-stoichiometric oxides ($SiO_x$) and subsequent separation of the deposited mixture into nanocrystals of Si and silicon dioxide by thermal treatment. Alternatively, it is possible to produce the structure by deposition of a $Si/SiO_2$ super-lattice and subsequent thermal treatment.

Yet a further process is that of electrochemical dissolution of the silicon, followed by a thermal treatment step to form oxidized porous silicon.

The ion implantation process described has enabled silicon nanocrystals of approximately 1.5 nm radius to be produced at a concentration of $2 \times 10^{19}$ $cm^{-3}$, substantially in a region formed at a depth of approximately 110 nm from the surface of the substrate and of approximately 100 nm thickness.

Advantageously, nanocrystals formed by approximately 500 Si atoms, of which at least 35% were surface atoms in contact with the oxide matrix in which the nanocrystals were immersed, have been produced.

Figure 3:
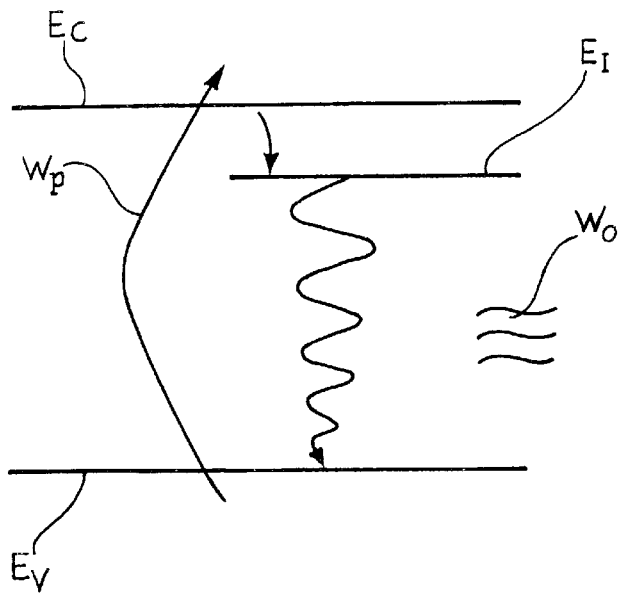
FIG. 3 is a schematic representation of the energy-band diagram in a structure of nanocrystals immersed in a silicon dioxide matrix.

The energy-band diagram in a structure of nanocrystals immersed in a silicon dioxide matrix according to the invention and the physical processes which bring about the emission of light are now described in outline with reference to FIG. 3.

The operation of the device is described with reference to an experimental configuration in which an optical pump with a laser beam of 390 nm wavelength ($W_p$) was used to bring about the necessary population inversion. A person skilled in the art will have no difficulty in extending the experimental behaviour described, in similar manner, to a configuration in which the population inversion is achieved by means of a carrier injection current.

The drawing shows a three-level model suggested for explaining the optical amplification phenomenon observed experimentally. The upper level of the valence band is indicated $E_V$ and the lower level of the conduction band of the nanocrystal is indicated $E_C$. The third level, indicated $E_I$, represents a radiative state associated with the interface between the nanocrystal and the oxide responsible for the 800 nm luminescent emission band and for the optical amplification.

In the nanocrystals having the dimensions mentioned above, it is possible to have about 150 interface states available per nanocrystal, upon the assumption that each surface Si atom is bound to a single O atom (Si=O bond).

The optical excitation brought about by the pump signal contributes to the emptying of the valence band and to the population of the conduction band of the nanostructure. The electrons in the conduction band decay rapidly to the intermediate state $E_I$ in which they have long life times of the order of one hundred microseconds. The population inversion is thus achieved between the level of the valence band $E_V$ and the level of the interface radiative state $E_I$.

According to a currently-preferred interpretation model, the rate of depopulation of the valence band is much greater than the rate of repopulation by carrier recombination, mediated by the intermediate oxide-nanocrystal interface state $E_I$, and this enables the population inversion to be achieved between the valence band and the radiative state.

According to the model, in an excitation condition of the order of $10^{22}$ phonons per $cm^2$ per second, more than 100 electron-hole pairs are generated per nanocrystal.

The radiative recombination of the electron-hole pairs generated thus gives rise to the output coherent light signal $w_o$.

Experimentally, when the device was in operation, a wide emission band was observed with a maximum at a wavelength of 800 nm, which is characteristic of the phenomenon of radiative recombination of carriers in silicon nanocrystals, the radiation maximum being shifted towards shorter wavelengths as the dimensions of the crystals decreased.

FIG. 4 shows an example of the integration of optoelectronic devices into CMOS technology, in which the light-emitting device 10 according to the invention, in the vertical arrangement of FIG. 1, is disposed beside an electric driver MOS transistor 30. The drain electrode 31 of the transistor forms a first metal contact for the device 10, towards a first contact polysilicon layer 32 disposed above the active region 12 in the drawing. A second metal contact 33 on the side of the laser device 10 remote from the transistor 30 forms the connection for connecting the rest of the electric driver circuit (not shown) to a second contact polysilicon layer 34 disposed below the active region.

A fundamental advantage of the device of the invention is that it can be integrated easily with electronic circuits formed in CMOS technology. In fact, the active region of the device is formed exclusively on a silicon basis (Si, SiO$_2$), in contrast with commercially-available semiconductor lasers which require different active semiconductor materials (for example, gallium arsenide or indium phosphide). All of the structures which make up the device (the active region, the semi-reflective mirrors, the contacts) can be defined simultaneously with the defining of the electrical circuits which constitute the driver circuits of the device, or at least by the same techniques and apparatus.

Advantageously, the manufacture and integration of the device does not therefore have a great effect in terms of the costs and logistics of the manufacturing plants and can be introduced directly into any CMOS manufacturing process.

Moreover, particularly with regard to technological developments in the field, the circuits comprising these devices can advantageously be miniaturized to a greater extent than is the case with hybrid technologies.

What is claimed is:

1. A silicon-based material suitable as an active region for light amplification, comprising a silicon dioxide substrate including amporphous silicon nanostructures or crystalline silicon nanocrystals, said material having the property of achieving stimulated emission of coherent light upon excitation.

2. A material according to claim 1, as obtainable by ion implantation of silicon ions in the silicon dioxide substrate and subsequent thermal annealing.

3. A material according to claim 1, as obtainable by chemical vapour deposition of sub-stoichiometric silicon oxides or super-lattices and subsequent thermal treatment.

4. A material according to claim 1, as obtainable by chemical dissolution of silicon and subsequent thermal oxidation treatment.

5. A silicon-based light-emitting device, comprising, in combination:

an active region which can emit photons at optical frequencies as a result of radiative recombination of the charge carriers confined therein, an excitation system which can alter the thermodynamic equilibrium of the carrier populations in order to bring about a condition of population inversion within the active region, and semi-reflective means for defining a resonant optical structure in which the active region is inserted so as to bring about stimulated emission of coherent light, wherein the active region comprises silicon nanostructures immersed in a dielectric matrix based on silicon dioxide.

6. A light-emitting device according to claim 5, wherein the silicon nanostructures are amorphous silicon nanostructures.

7. A light-emitting device according to claim 5, wherein the silicon nanostructures are crystalline silicon nanostructures.

8. A light-emitting device according to claim 5, wherein the nanostructures are obtainable by ion implantation of silicon ions in the silicon dioxide matrix and subsequent thermal annealing of the material.

9. A light-emitting device according to claim 8, wherein the nanostructures are obtainable by ion implantation, at 80 keV, of $1 \times 10^{17}$ Si ions per cm$^2$ in ultra-pure quartz substrates and subsequent thermal treatment at a temperature of 1100° C. for 1 hour.

10. A light-emitting device according to claim 8, wherein the nanostructures are obtainable by ion implantation, at 80 keV, of $1 \times 10^{17}$ Si ions per cm$^2$ in silicon dioxide layers grown thermally on silicon substrate and subsequent thermal treatment at a temperature of 1100° C. for 1 hour.

11. A light-emitting device according to claim 5, wherein the nanostructures are obtainable by chemical vapour deposition of sub-stoichiometric silicon oxides or super-lattices and subsequent thermal treatment of the material.

12. A light-emitting device according to claim 5, wherein the nanostructures are obtainable by chemical dissolution of silicon and subsequent thermal oxidation treatment of the material.

13. A light-emitting device according to claim 5, wherein the semi-reflective means comprise a pair of distributed Bragg reflectors disposed on opposite sides of the active region along the light-emission axis.

14. A light-emitting device according to claim 5, wherein the semi-reflective means comprise a Bragg grating disposed adjacent the active region so as to form a distributed-feedback structure.

15. A light-emitting device according to claim 5, wherein the semi-reflective means comprise at least one metal layer.

16. A light-emitting device according to claim 5, wherein the active region is inserted in a wave-guide structure.

17. A light-emitting device according to claim 5, wherein the excitation system comprises a pumping laser outside the device.

18. A light-emitting device according to claim 5, wherein the excitation system comprises electrical contacts for the injection of carriers into the active region.

19. A light-emitting device according to claim 18, wherein a pair of contacts is defined for the injection of carriers at the ends of the active region, along the light-emission axis.

20. A light-emitting device according to claim 19, wherein the contacts are formed as deep annular channels of doped polysilicon, arranged concentrically and insulated from one another by an oxide layer, each channel carrying at its buried end a terminal for contact with the active region.

21. A light-emitting device according to claim 18, wherein the contacts are formed in a MOS-type configuration perpendicular to the light-emission axis.

22. A chip comprising a plurality of electronic components and at least one light-emitting device according to claim 5, integrated on a single silicon-based substrate.

23. A chip according to claim 22, wherein an electronic driver circuit is associated with the at least one light-emitting device and comprises a transistor, one of the electrodes of the driver transistor extending to form a first electrical contact for the injection of carriers into the active region of the light-emitting device, and the second electrical contact extending to form a further node of the electronic driver circuit.

* * * * *